(12) United States Patent
Bonthron

(10) Patent No.: US 8,150,270 B2
(45) Date of Patent: Apr. 3, 2012

(54) COMPACT HIGH-SPEED MODULATOR DRIVER METHOD AND APPARATUS

(75) Inventor: Andrew John Bonthron, Los Angeles, CA (US)

(73) Assignee: Kitel Technologies LLC, Los Angeles, CA (US)

( * ) Notice: Subject to any disclaimer, the term of this patent is extended or adjusted under 35 U.S.C. 154(b) by 491 days.

(21) Appl. No.: 12/383,910

(22) Filed: Mar. 30, 2009

(65) Prior Publication Data

US 2009/0243717 A1 Oct. 1, 2009

Related U.S. Application Data

(60) Provisional application No. 61/072,503, filed on Mar. 31, 2008.

(51) Int. Cl.
H04B 10/04 (2006.01)

(52) U.S. Cl. ............... 398/188; 398/183; 398/182

(58) Field of Classification Search ........... 398/188, 398/183, 182
See application file for complete search history.

(56) References Cited

U.S. PATENT DOCUMENTS

| | | |
|---|---|---|
| 5,355,094 A | 10/1994 | Soda |
| 5,625,722 A | 4/1997 | Froberg et al. |
| 6,002,510 A | 12/1999 | Ishizaka |
| 6,329,879 B1 | 12/2001 | Maruyama et al. |
| 6,552,837 B2 | 4/2003 | Mirshekar-Syahkal et al. |
| 6,639,461 B1 | 10/2003 | Tam et al. |
| 6,707,589 B2 | 3/2004 | Bostak et al. |
| 6,738,173 B2 | 5/2004 | Bonthron et al. |
| 6,794,934 B2 * | 9/2004 | Betti-Berutto et al. ... 330/124 R |
| 6,810,159 B2 | 10/2004 | Olesen |
| 6,836,185 B1 * | 12/2004 | Pobanz .................. 330/260 |
| 6,930,557 B2 | 8/2005 | Shigematsu |
| 7,079,780 B1 * | 7/2006 | Rollins .................. 398/198 |
| 7,099,596 B2 | 8/2006 | Watanabe et al. |
| 7,295,072 B2 | 11/2007 | Takaso et al. |
| 2004/0000924 A1 * | 1/2004 | Best et al. .................. 326/30 |

* cited by examiner

*Primary Examiner* — Kinam Park

(57) ABSTRACT

Modulator driver for driving an electro-optical modulator in a high-speed optical communications system. In accordance with aspects of the present invention, a modulator driver is presented comprising an input differential limiting amplifier which is coupled to a distributed differential current-switch configuration, where one set of outputs of the distributed differential current-switch configuration are grounded and the other set of outputs are connected to an artificial transmission line structure generating forward traveling and reverse traveling signals, with the reverse traveling signal termination bias inductively coupled to a separately adjustable positive bias voltage, whereby the circuit architecture reduces the number of components and transitions in the high-speed signal path and is compatible with compact, monolithic fabrication requiring a minimal amount of external components for operation. Other methods and apparatus are presented.

20 Claims, 8 Drawing Sheets

COMPACT HIGH-SPEED MODULATOR DRIVER METHOD AND APPARATUS

CROSS-REFERENCE TO RELATED APPLICATIONS

This application claims the benefit of U.S. Provisional Application No. 61/072,503, filed Mar. 31, 2008 by the present inventor, which is incorporated herein by reference.

FIELD OF THE INVENTION

The subject matter disclosed generally relates to the field of digital communications devices. More specifically, the subject matter disclosed relates to electronic arrangements for high-speed, electro-optical data transmission applications.

BACKGROUND OF THE INVENTION

An important element in high-speed fiber-optic transmission systems is the ability to optically encode data bits for transport in optical fiber media. One way this is achieved is through the modulation of the output of a continuous-wave laser source by an electro-optical modulator, whose output is coupled to an optical fiber for transmission. Many applications require high quality optical modulation performance, which imposes amplitude and signal quality requirements on the drive electronics, often referred to as a modulator driver, required to interface with the electro-optical modulator. Additionally, as optical network data rates increase, many applications require the electrical modulator driver to maintain the appropriate signal requirements for achieving high quality optical modulation performance at higher data rates.

FIG. 1 illustrates the top view of typical electro-optical modulator integrated circuit known in the art which is capable of providing modulation of an optical signal, based on a Mach-Zehnder interferometer technique with single-ended electrical drive input. A continuous-wave optical signal is input to an optical waveguide 12 where it is split into two paths. An electrical data signal from a single-ended modulator driver is input to the RF IN port where it travels along an electrical transmission line 14 between the optical waveguide paths, and creates an electric field between the transmission line and two ground electrodes 21, 22. Due to the geometry of the layout, the electric field distribution will have opposite polarity in each of the optical waveguides, producing a change in the phase in each of the optical waveguides that has opposite direction. With a sufficiently large electrical signal amplitude, typically 4 to 8 volts peak-to-peak, the phase shifts induced in the optical waveguide paths, when combined, will cause the optical output signal to be modulated.

A large amplitude drive signal is difficult to achieve at high-speed data rates due to the parasitics of the transistor device sizes required to generate the large electrical output voltage swings. One method known in the art for overcoming the bandwidth limitations imposed by the device parasitics is the use of a single-ended distributed amplifier. A typical single-ended distributed amplifier topology is illustrated in FIG. 2. In this topology, an input signal travels along an artificial transmission line formed by inductive elements 31 and the input capacitance of transistor amplifier stages 40. The traveling wave input signal is amplified by the transistor amplifier stages 40 which in turn output signals onto an output artificial transmission line formed by inductive elements 32 and the output capacitance of the transistor amplifier stages 40. The output signals will have a forward and reverse traveling wave component, where the reverse traveling wave component is terminated by the termination 35, and the forward traveling wave signal will be output from the distributed amplifier. A bias-T structure 42 is typically disposed at the output port and used to provide access to a positive supply voltage VCC for biasing of the transistor amplifier stages 40.

While the topology in FIG. 2 can provide wideband amplification and large output amplitude capability, it has several limitations when used for modulator driver applications. One limitation is that adjustment of the output signal amplitude and duty cycle can be difficult, typically requiring external circuitry for simultaneous adjustment of the supply voltage VCC and gate bias voltage VG. Another limitation is that the gain of this distributed amplifier topology is typically lower than required for single-ended modulator driver applications. To achieve higher gain, multiple single-ended distributed amplifiers 60, 61 are typically used in series, such as illustrated in FIG. 3, which adds complexity, size and cost. A further limitation is that stabilization of the output signal amplitude over a range of input signal amplitudes can be difficult, typically requiring amplifier saturation which can cause poorly controlled output signal rise and fall times. Finally, typical inter-stage bias-T components for the broadband transmission of data are inconsistent with monolithic IC fabrication techniques, which can result in the use of bulky multi-chip modules to achieve the modulator driver function.

Accordingly, it would be desirable to have a single-ended output modulator driver architecture capable of high output amplitude, high gain, and high-speed data transmission and compatible with compact, monolithic process fabrication techniques with a minimum of external components required for operation. In addition, it would be desirable to have a single-ended output modulator driver architecture with input limiting function capable of providing a stabilized output signal amplitude over a range of input signal amplitudes. Furthermore, it would be desirable to have a single-ended output modulator driver architecture with simple control circuitry for output amplitude and output duty-cycle adjustment.

SUMMARY OF THE INVENTION

Modulator driver for driving an electro-optical modulator in a high-speed optical communications system. In accordance with aspects of the present invention, a modulator driver is presented comprising an input differential limiting amplifier which is coupled to a distributed differential switch configuration, where one set of outputs of the distributed differential switch configuration are grounded and the other set of outputs are connected to an artificial transmission line structure generating forward traveling and reverse traveling signals, with the reverse traveling signal termination bias inductively coupled to a separately adjustable positive bias voltage, whereby the circuit architecture reduces the number of components and transitions in the high-speed signal path and is compatible with compact, monolithic fabrication requiring a minimal amount of external components for operation. Other methods and apparatus are presented.

BRIEF DESCRIPTION OF THE DRAWINGS

The accompanying drawings are for the purpose of illustrating and expounding the features involved in the present invention for a more complete understanding, and not meant to be considered as a limitation, wherein.

DETAILED DESCRIPTION OF THE INVENTION

Figure 1:
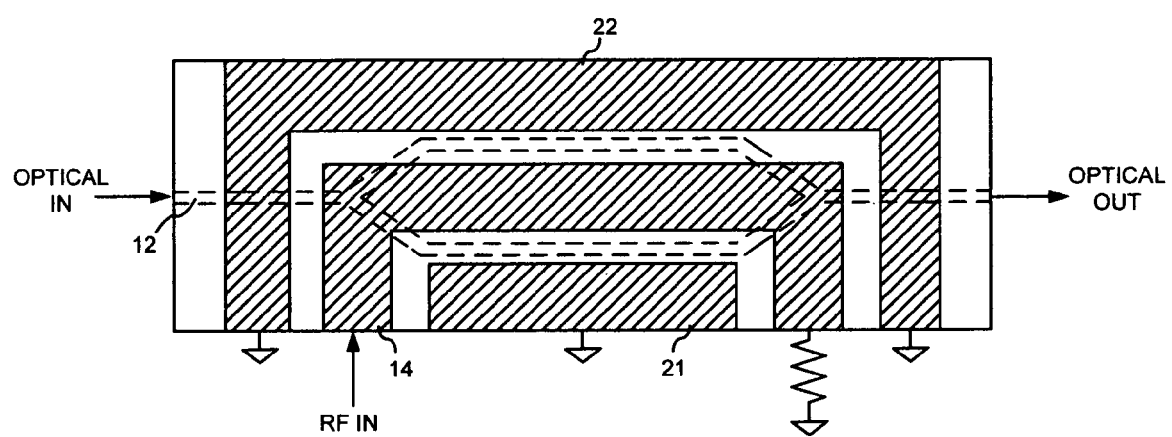
FIG. 1 is a diagram of a known electro-optical modulator architecture with a single-ended electrical drive port structure.
Figure 2:
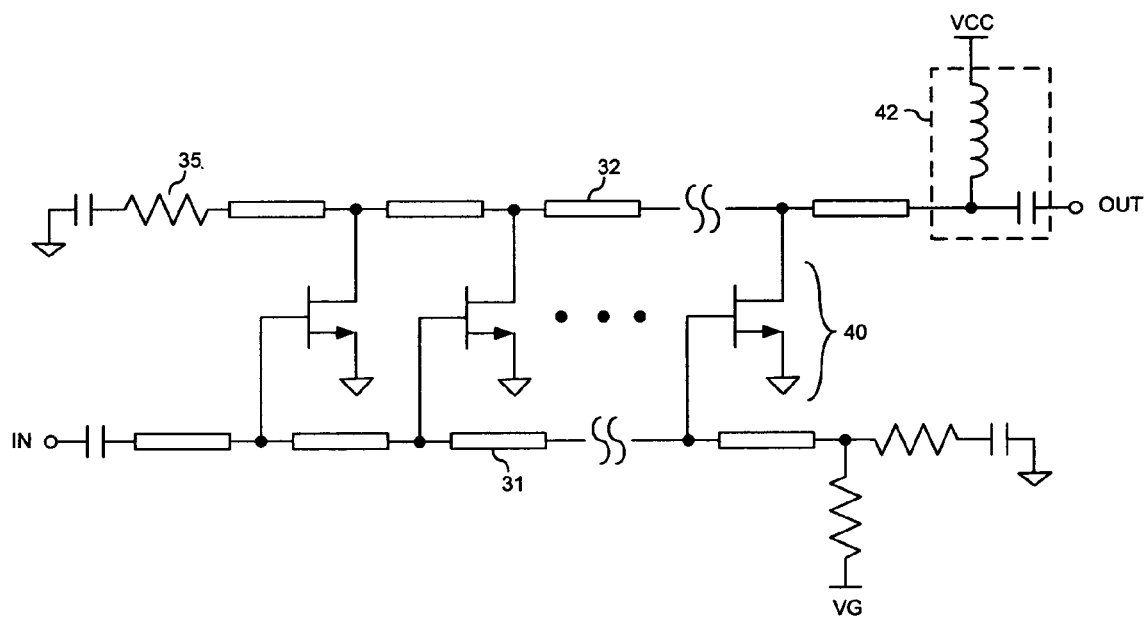
FIG. 2 is a schematic diagram of a known single-ended distributed amplifier driver circuit.
Figure 3:
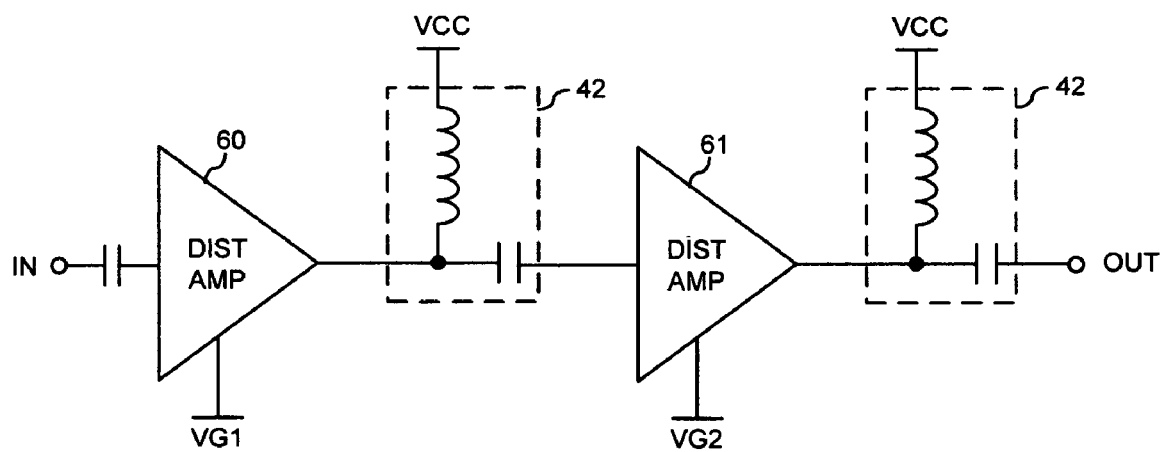
FIG. 3 is a block diagram of a known multi-stage single-ended driver architecture utilizing multiple series-connected distributed amplifiers.
Figure 4:
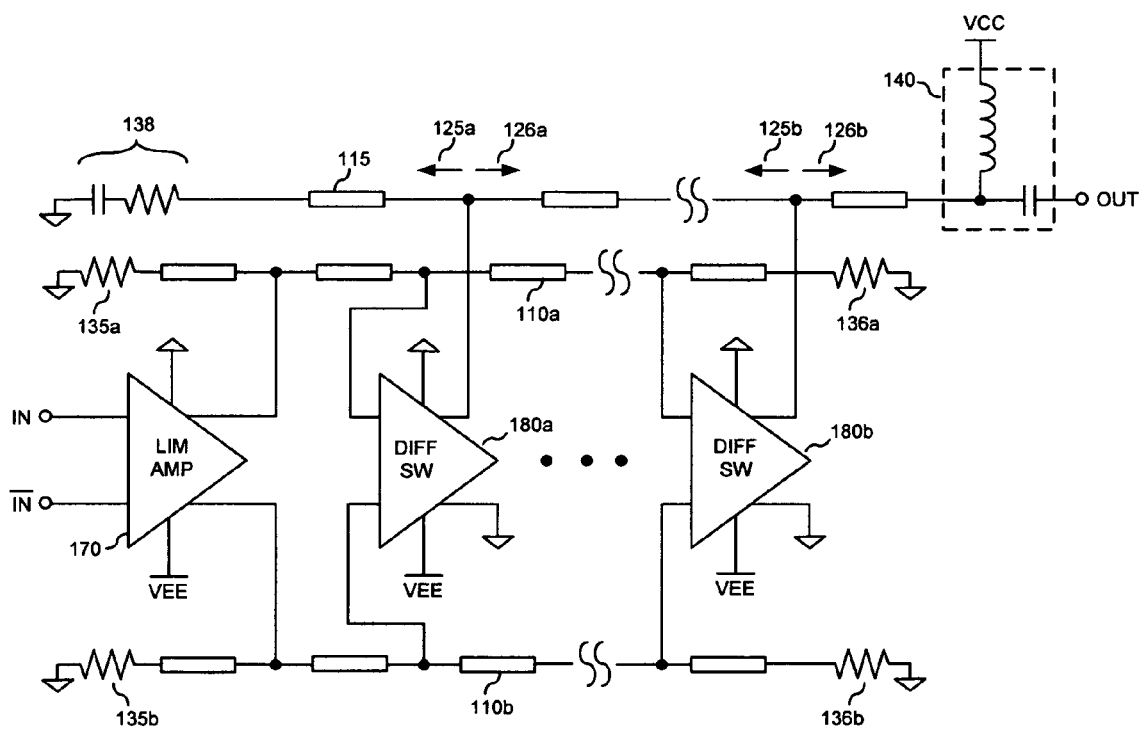
FIG. 4 is a schematic diagram illustrating one modulator driver arrangement for use with a single-ended electrical drive electro-optical modulator according to aspects of the present invention.

A modulator driver arrangement is presented in FIG. 4 as one embodiment of aspects of the present invention. In this arrangement, an input signal is coupled to a limiting amplifier 170 which provides an input signal limiting function and outputs a differential output signal with a leveled amplitude. The limiting amplifier has the ability to accept differential input signals as illustrated in FIG. 4, or a single-ended input signal coupled to one input of the limiting amplifier 170 through a DC blocking capacitor, with the limiting amplifier 170 further providing a single-ended to differential signal conversion function. The output differential signal from limiting amplifier 170 is coupled to a differential artificial transmission line comprised of inductive elements 110a, 110b disposed between differential signal inputs to differential current switches 180a, 180b, and further comprised of reverse differential traveling wave signal termination resistors 135a, 135b as well as forward differential traveling wave signal termination resistors 136a, 136b. The differential current switches 180a, 180b provide a modulation current switched between differential outputs, one of the differential output signals coupled to ground, while the other output signal is coupled to a single-ended artificial transmission line comprised of inductive elements 115 disposed between output signal connections from differential current switches 180a, 180b, and further comprised of a termination 138 for the termination of reverse single-ended traveling wave signals 125a, 125b, as well as an output port (OUT) for transmission of forward single-ended traveling wave signals 126a, 126b. A bias-T 140 is disposed in series with the output port to provide a positive biasing voltage VCC to one output connection of each of the differential current switches 180a, 180b in order to provide sufficient headroom for generation of a large output signal amplitude. By coupling one of the differential outputs of each of the differential current switches 180a, 180b to ground, power dissipation in the modulator driver is significantly reduced in comparison to a situation where both outputs are biased by VCC, as well as significantly reducing the area required to layout the modulator driver by eliminating the need for a complimentary output artificial transmission line. Through the use of this topology, the modulator driver arrangement provides a large amplitude, high-speed, single-ended output signal capability with tolerance to input signal amplitude variations, while only using a limited amount of distributed, circuitry. In addition, since the inter-stage bias-T and DC blocking capacitors have been eliminated, this allows compact, monolithic fabrication of the modulator driver requiring only a minimum of external components for proper operation, such as an external bias-T, external DC blocking capacitors, and external bypass capacitors.

Figure 5:
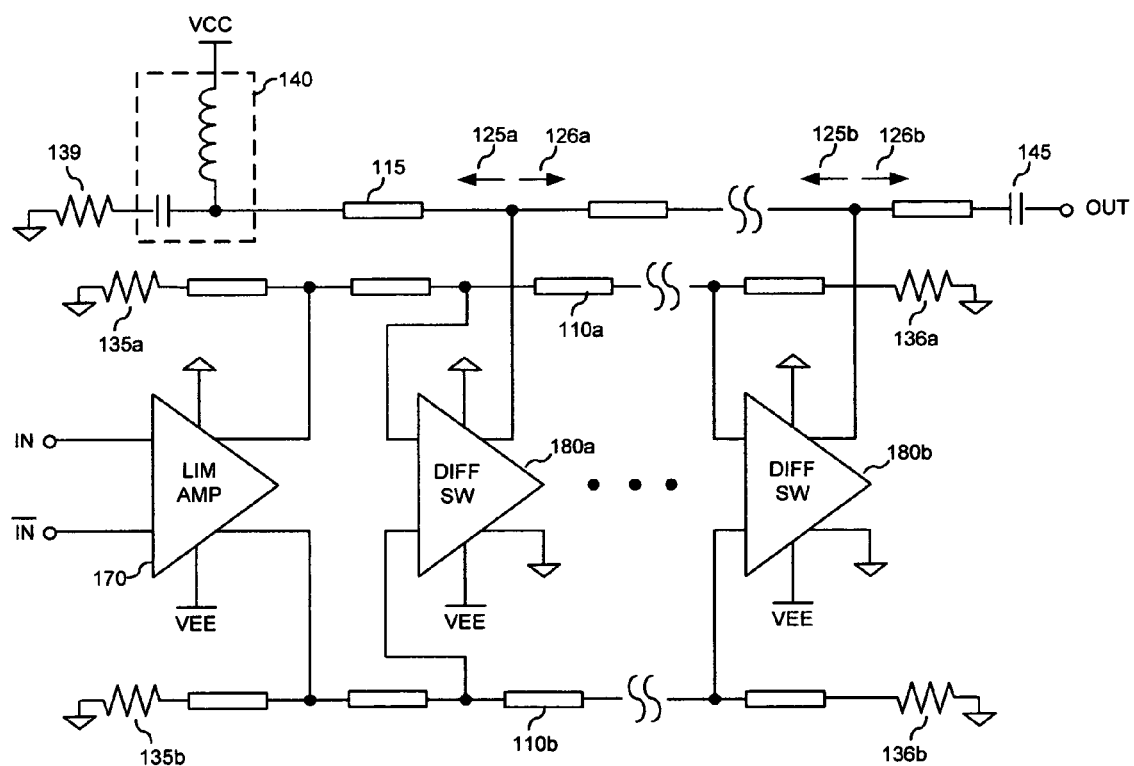
FIG. 5 is a schematic diagram illustrating another modulator driver arrangement for use with a single-ended electrical drive electro-optical modulator according to aspects of the present invention.
Figure 6A:
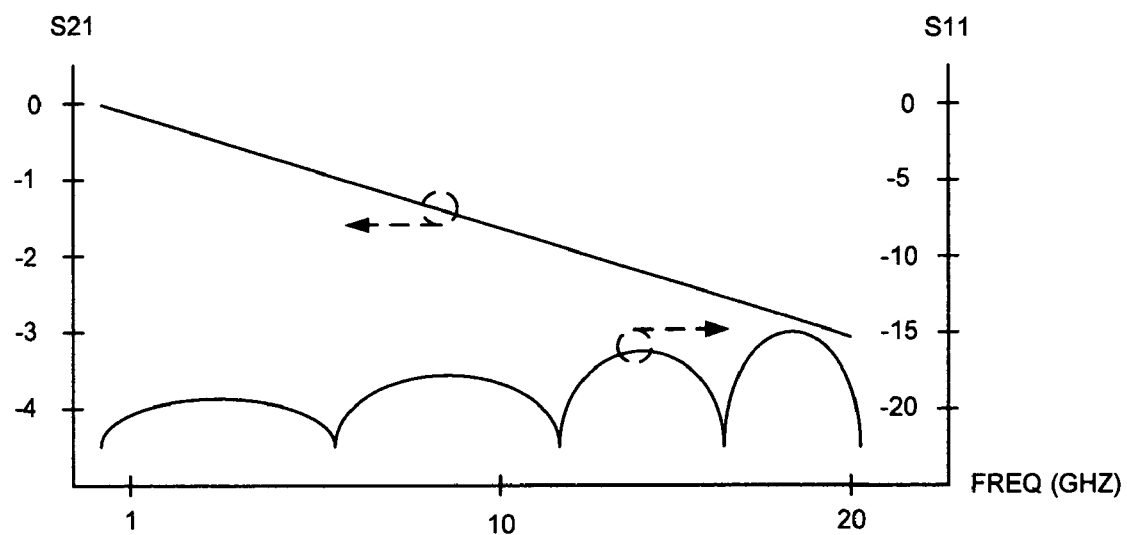
FIG. 6A is a graph illustrating the typical response of a bias-T component.
Figure 6B:
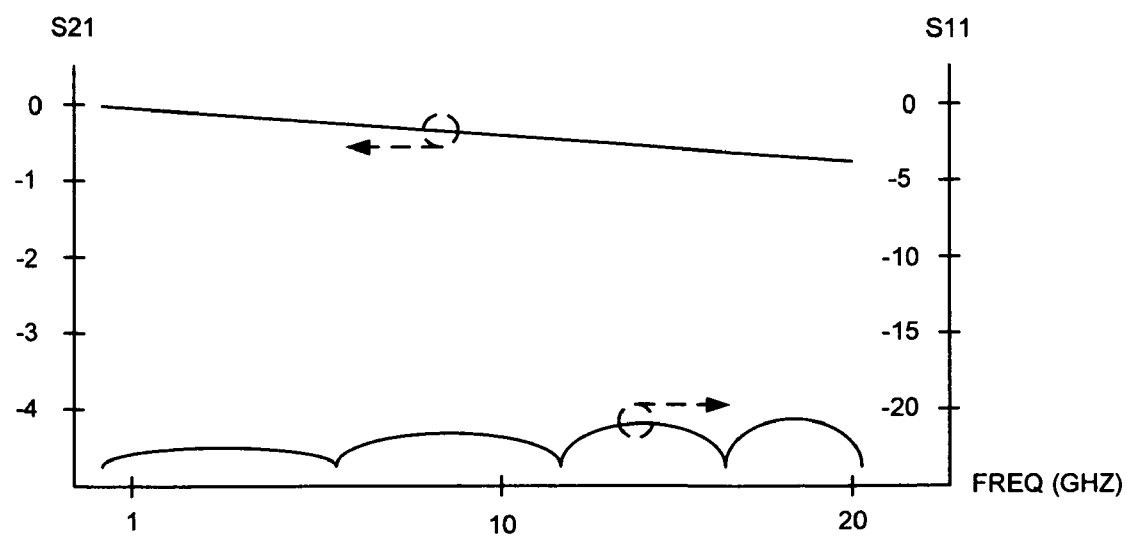
FIG. 6B is a graph illustrating the typical response of a DC blocking capacitor.

A modulator driver arrangement is presented in FIG. 5 as another embodiment of aspects of the present invention. The arrangement in FIG. 5 is similar to the arrangement in FIG. 4, except that the position of bias-T 140 is moved away from being in-series with the output port (OUT) to the termination end of the output artificial transmission line, and a DC blocking capacitor 145 is positioned in-series with the output port (OUT). The same components are denoted by the same reference numerals, and will not be explained again. In this arrangement, the bias-T 140 is no longer is series with the forward traveling wave signals 126a, 126b, but rather is positioned at the termination end of the output artificial transmission line prior to the terminating resistor 139 used for termination of the reverse traveling wave signals 125a, 125b. This arrangement has the benefit of reducing the number of components in-series with the high-speed output signal path. As an example, the loss and impedance match of a typical bias-T in a transmission line environment is illustrated in FIG. 6A, while the loss and impedance match of a typical DC blocking capacitor in a transmission line environment is illustrated in FIG. 6B for comparison purposes. While the bias-T provides an adequate impedance match, the loss is significant at higher frequency, which has the effect of degrading the output signal quality of the modulator driver when the bias-T is positioned in series with the forward traveling wave output signal. In comparison, the DC blocking capacitor has far lower loss over frequency as well as a superior impedance match, improving the output signal quality of the modulator driver. The position of the bias-T 140 in FIG. 5 still provides the required positive biasing voltage VCC to the differential current switches 180a, 180b, and the impedance match of the bias-T 140 is sufficient to allow adequate termination of the reverse-traveling wave signals 125a, 125b in termination resistor 139.

The modulator driver arrangements illustrated in FIGS. 4 and 5 can be modified according to aspects of the present invention. One example of such a modification, not meant as a limitation, is for the differential current switches 180a, 180b to include a signal amplification function prior to the modulation current switching function. Another example of such a modification, not meant as a limitation, is the use of multiple lumped-element stages for the realization of the limiting amplifier 170 or differential current switches 180a, 180b. A further example of such a modification, not meant as a limitation, is to vary the number of differential current switches 180a, 180b that are utilized to comprise the distributed output stage of the modulator driver, trading-off application requirements for output signal amplitude, operating frequency, size and cost. A variety of elements known to those skilled in the art, such as amplifiers, buffers, gain blocks, limiters, equalizers, resistors, capacitors, inductors, bias-T components, transmission lines, and the like, can be added to or deleted from the described arrangement, or the position of existing elements may be modified, without changing the basic form or spirit of the invention.

Figure 7:
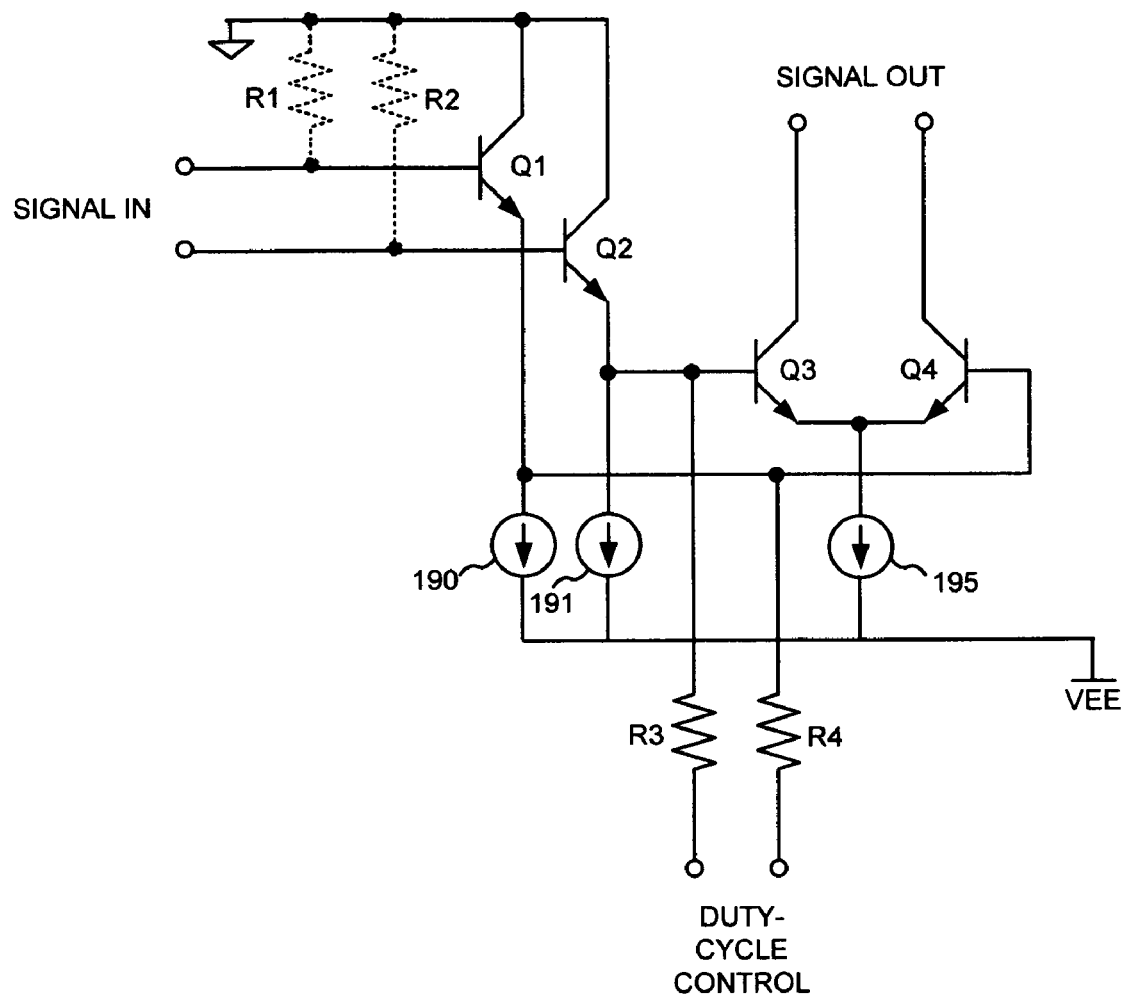
FIG. 7 is a schematic illustrating features of one embodiment of a differential circuit according to aspects of the present invention.

A circuit arrangement is illustrated in FIG. 7 as one embodiment of a differential current switch 180a, 180b, and as one embodiment of a differential limiting amplifier 170 according to aspects of the present invention. In this arrangement, a differential input signal (SIGNAL IN) is coupled to transistors Q1, Q2 which form an emitter-follower configuration with current sources 190, 191. The emitter-follower transistors Q1, Q2 provide a high input impedance and low signal loss, which is compatible with the distributed input signal structure presented to the differential current switches 180a, 180b. Additional pull-up resistors R1, R2 provide input terminations if this circuit configuration is utilized as part of the input limiting amplifier 170. The output signals from the emitter-follower configuration are coupled to transistors Q3, Q4 which form a common-emitter configuration with current source 195. The differential output signals (SIGNAL OUT) are provided by the collectors of transistors Q3, Q4. Current source 195 provides the output current which is steered between the differential signal output lines through application of a differential signal at the bases of emitter-coupled transistors Q3, Q4. Depending on the amplitude of this differential signal applied to the bases of emitter-coupled transistors Q3, Q4, the current from current source 195 is either partially steered between or fully switched between the differential signal output lines, determining the amount of limiting function in the limiting amplifier 170, or providing the basis of the current-switch function in the differential current switches 180a, 180b. Also, the amplitude of the output differential signal is proportional to the current of the current source 195, which provides a simple method of output amplitude control. In addition, the incorporation of a small-valued series resistor within the current source 195 circuitry provides a simple method of monitoring the output signal amplitude, through monitoring of the voltage across the series resistor. Furthermore, resistors R3, R4 provide a simple method for adjusting the duty-cycle of the output signal through the application of an external differential voltage (DUTY-CYCLE CONTROL). Additionally, this configuration allows monolithic fabrication of essentially all of the circuitry of a modulator driver having an architecture as illustrated in FIGS. 4 and 5, requiring only a minimum of external components for proper operation, such as an external bias-T, external DC blocking capacitors, and external bypass capacitors.

Figure 8:
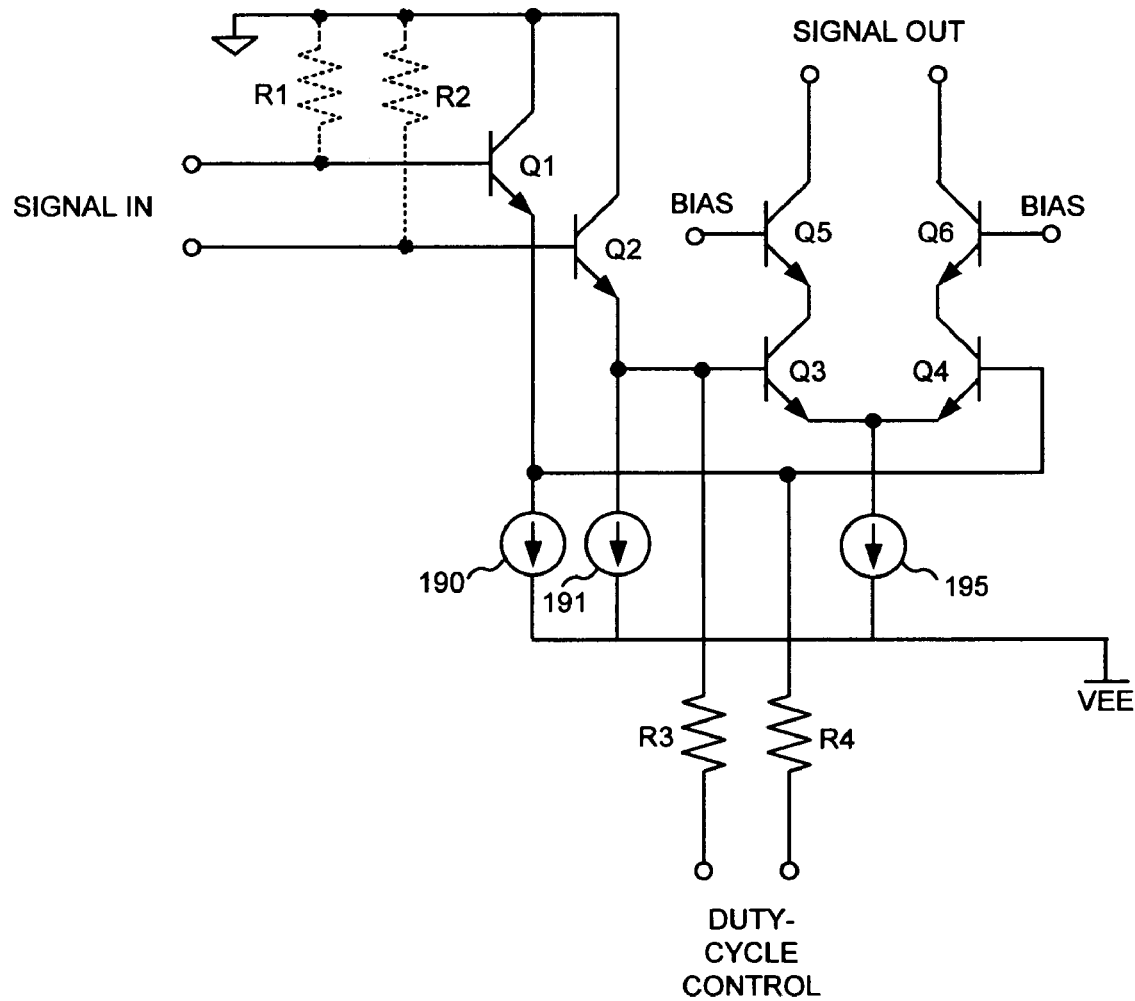
FIG. 8 is a schematic illustrating features of another embodiment of a differential circuit according to aspects of the present invention.

A circuit arrangement is illustrated in FIG. 8 as another embodiment of a differential current switch 180a, 180b, and as another embodiment of a differential limiting amplifier 170 according to aspects of the present invention. The arrangement in FIG. 8 is similar to the arrangement in FIG. 7, except for the addition of transistors Q5, Q6 which form a cascode circuit arrangement. The same components are denoted by the same reference numerals, and will not be explained again. In this arrangement, the differential current signals from the collectors of Q3, Q4 are buffered by transistors Q5, Q6 which then output the differential output signals (SIGNAL OUT) from the collectors of transistors Q5, Q6. A biasing voltage (BIAS) is provided to the bases of transistors Q5, Q6 for proper operation. This configuration enhances the operating speed of the circuit through the reduction of the Miller capacitance effect. In addition, this configuration enhances the performance in a distributed configuration through reduction of the loading of the output artificial transmission lines. Furthermore, this configuration allows monolithic fabrication of essentially all of the circuitry of a modulator driver having an architecture as illustrated in FIGS. 4 and 5, requiring only a minimum of external components for proper operation, such as an external bias-T, external DC blocking capacitors, and external bypass capacitors.

The circuit arrangements illustrated in FIGS. 7 and 8 can be modified according to aspects of the present invention. One example of such a modification, not meant as a limitation, is the use of multiple stages of circuitry for realization of the limiting amplifier or differential current switch functionality. Another example of such a modification, not meant as a limitation, is the use of other differential circuit topologies, such as differential Darlington amplifier circuitry, Cherry-Hooper amplifier circuitry, or any combination of these and the previously described circuits. A further example of such a modification, not meant as a limitation, is the use of CMOS, bi-CMOS, FET, HEMT, HBT, or DHBT transistors to realize the circuit functions rather than the illustrated bi-polar transistors. A variety of elements known to those skilled in the art, such as amplifiers, buffers, gain blocks, equalizers, resistors, capacitors, inductors, transistors, transmission lines, and the like, can be added to or deleted from the described arrangement, or the position of existing elements may be modified, without changing the basic form or spirit of the invention.

Although the preceding examples have illustrated single-channel modulator driver arrangements, the concepts and methods described are extendable to multi-channel driver arrays without departing from the spirit of the present invention. In addition, although the preceding examples illustrate the use of a negative supply voltage, a positive supply voltage, and ground as biasing potentials, the concepts and methods described are extendable to any multi-potential biasing arrangement where the one set of outputs from a distributed differential current-switch arrangement are coupled to a potential rather than an artificial transmission line.

The preceding concepts, methods, and architectural elements described are meant to illustrate advantages and aspects of the present invention, not as a limitation. Different combinations of these concepts, methods, and architectural elements than that described in the preceding figures can be utilized by one of ordinary skill in the art without departing from the spirit of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A modulator driver apparatus for driving an electro-optical modulator in a high-speed optical communications system, comprising:
   a differential limiting input amplifier configured to generate differential output signals in response to an input signal;
   a distributed limiting power amplifier comprising a plurality of differential current switching stages having differential inputs inductively coupled to form differential input artificial transmission lines, said differential input artificial transmission lines DC coupled to said differential output signals from said differential limiting input amplifier; and
   a single-ended output artificial transmission line formed by inductively coupling one output signal from each of said differential current switching stages, the other output signal from each of said differential current switching stages being terminated,
   whereby the configuration of said differential limiting input amplifier and said distributed limiting power amplifier provides a compact form consistent with monolithic fabrication in an integrated circuit process.

2. The apparatus of claim 1, wherein said differential current switching stages generate forward-traveling and reverse-traveling signals on said output artificial transmission line.

3. The apparatus of claim 2, further comprising a termination resistor for termination of said reverse-traveling signals on said output artificial transmission line.

4. The apparatus of claim 3, further comprising an inductively coupled biasing circuit connected between said output artificial transmission line and said termination resistor.

5. The apparatus of claim 4, wherein said inductively coupled biasing circuit is a bias-T.

6. The apparatus of claim 3, further comprising an inductively coupled biasing circuit connected at the output of said output artificial transmission line.

7. The apparatus of claim 1, wherein said other output signal from each of said differential current switching stages is terminated to ground.

8. The apparatus of claim 1, wherein said other output signal from each of said differential current switching stages is terminated to a DC voltage potential.

9. The apparatus of claim 1, wherein said input signal to said differential limiting input amplifier is differential.

10. The apparatus of claim 1, wherein said input signal to said differential limiting input amplifier is single-ended and said differential limiting input amplifier further provides a single-ended to differential signal conversion function.

11. The apparatus of claim 1, wherein said differential current switching stages comprise transistors arranged in a differential common-emitter amplifier configuration.

12. The apparatus of claim 1, wherein said differential current switching stages comprise transistors arranged in a differential common-source amplifier configuration.

13. The apparatus of claim 1, wherein said differential current switching stages comprise transistors arranged in a differential cascode amplifier configuration.

14. The apparatus of claim 1, further comprising a plurality of said differential limiting input amplifiers and said distributed limiting power amplifiers to generate a plurality of output signals.

15. The apparatus of claim 1, wherein said integrated circuit process is a bipolar process.

16. The apparatus of claim 1, wherein said integrated circuit process is a bi-CMOS process.

17. The apparatus of claim 1, wherein said integrated circuit process is an HBT process.

18. The apparatus of claim 1, wherein said integrated circuit process is a DHBT process.

19. The apparatus of claim 1, wherein said integrated circuit process is a HEMT process.

20. The apparatus of claim 1, wherein said output artificial transmission line provides an output signal to the electro-optical modulator.

* * * * *